US007673583B2

(12) United States Patent
Brcka

(10) Patent No.: US 7,673,583 B2
(45) Date of Patent: Mar. 9, 2010

(54) LOCALLY-EFFICIENT INDUCTIVE PLASMA COUPLING FOR PLASMA PROCESSING SYSTEM

(75) Inventor: Jozef Brcka, Loundonville, NY (US)

(73) Assignee: Tokyo Electron Limited, Tokyo (JP)

( * ) Notice: Subject to any disclaimer, the term of this patent is extended or adjusted under 35 U.S.C. 154(b) by 802 days.

(21) Appl. No.: 11/278,263

(22) Filed: Mar. 31, 2006

(65) Prior Publication Data

US 2006/0254519 A1 Nov. 16, 2006

Related U.S. Application Data

(63) Continuation-in-part of application No. 10/717,268, filed on Nov. 19, 2003, now Pat. No. 7,273,533.

(51) Int. Cl.
*C23C 16/00* (2006.01)
*C23F 1/00* (2006.01)
*H01L 21/306* (2006.01)
*H05B 31/26* (2006.01)

(52) U.S. Cl. .............................. 118/723 I; 118/723 IR; 156/345.48; 156/345.49; 315/111.51

(58) Field of Classification Search ............... 118/723 I, 118/723 IR; 156/345.48, 345.49; 315/111.51
See application file for complete search history.

(56) References Cited

U.S. PATENT DOCUMENTS

| 6,080,287 | A  | * | 6/2000  | Drewery et al. ........ 204/192.15 |
| 6,273,022 | B1 | * | 8/2001  | Pu et al. .................. 118/723 I |
| 6,534,493 | B1 |   | 3/2003  | Vazquez et al. |
| 6,652,711 | B2 |   | 11/2003 | Brcka et al. |
| 2001/0022158 | A1 | * | 9/2001 | Brcka et al. ................ 118/723 I |
| 2004/0060517 | A1 | * | 4/2004 | Vukovic et al. ........... 118/723 I |
| 2004/0079485 | A1 | * | 4/2004 | Lee et al. ................ 156/345.48 |
| 2005/0103445 | A1 |   | 5/2005  | Brcka et al. |

* cited by examiner

*Primary Examiner*—Parviz Hassanzadeh
*Assistant Examiner*—Rakesh K Dhingra
(74) *Attorney, Agent, or Firm*—Wood, Herron & Evans, L.L.P.

(57) ABSTRACT

An inductively coupled plasma source is provided with a peripheral ionization source for producing a high-density plasma in a vacuum chamber for semiconductor wafer coating or etching. The source has a segmented configuration with high and low radiation segments and produces a generally ring-shaped array of energy concentrations in the plasma around the periphery of the chamber. Energy is coupled from a segmented low inductance antenna through a dielectric window or array of windows and through a segmented shield or baffle. An antenna for the source is provided having concentrated conductor segments through which current flows in one or more high efficiency portions that produce high magnetic fields that couple through the high-transparency shield segments into the chamber, while alternating low efficiency conductor segments permit magnetic fields to pass through or between the conductors and deliver only weak fields, which are aligned with opaque shield sections and couple insignificant energy to the plasma. Conductor cross-sectional area or turn density differences may be used to distinguish high and low efficiency sections of the antenna conductor. Coil loops are provided in the high efficiency sections to locally increase inductance.

16 Claims, 6 Drawing Sheets

LOCALLY-EFFICIENT INDUCTIVE PLASMA COUPLING FOR PLASMA PROCESSING SYSTEM

This application is a Continuation-In-Part and Divisional of U.S. patent application Ser. No. 10/717,268, filed Nov. 19, 2003, hereby expressly incorporated herein by reference.

FIELD OF THE INVENTION

This invention relates to high-density plasma generating devices, systems and processes for the manufacture of semiconductor wafers. In particular, the invention relates to antenna structure for producing high-density inductively coupled plasmas (ICP) for such systems and processes.

BACKGROUND OF THE INVENTION

In a variety of integrated circuit (IC) fabrication processes, including plasma etching, plasma enhanced chemical vapor deposition (PECVD), and plasma sputter deposition applications, plasmas are produced within a process chamber by introducing a process gas at vacuum pressure into the chamber and then coupling electrical energy into the chamber to create and sustain a plasma in the process gas. The plasma may exist at various ionization fractions from $10^{-6}$ up to a fully ionized plasma.

Inductively coupled plasmas (ICP) are often used to produce high density plasmas, for example, for processes such as ionized PVD (iPVD) and some types of plasma etching. To generate such plasmas a coil or antenna is shaped and positioned with respect to the processing chamber to inductively couple energy into the processing chamber and thus create and sustain the plasma therein.

In some ICP systems, an inductive coil or antenna is positioned around or proximate the top portion or another end of the chamber to create a plasma within the chamber. Such an antenna is positioned on one side of a dielectric plate or window in the wall of the processing chamber, and electromagnetic energy from the antenna is coupled through the dielectric window and into the plasma. One suitable dielectric material for a window or chamber sidewall is quartz.

The geometry of an ICP system is a factor in determining both plasma density and uniformity, which, in turn, can affect the processing uniformity over the area of the substrate. It has often been regarded as desirable to produce a uniform, high-density plasma over a significantly large area so that large substrate sizes can be accommodated. Ultra large-scale integrated (ULSI) circuits, for example, are presently formed on wafer substrates having diameters of 200 mm and 300 mm.

Numerous coil configurations are used in inductively coupled plasma sources. Generally, these coils are becoming larger, requiring larger dielectric windows to allow RF energy to penetrate into plasma. Scaling up an external antenna for large area plasma in a conventional inductively coupled discharge meets such difficulties as thicker dielectric window to withstand atmospheric forces, and a higher inductance of antenna, significant increase of RF power. Problems also increase in the areas of stray capacitance, mutual coupling, voltage at the ends of scaled antenna, capacitive coupling between the antenna and plasma, sparking and arcing at atmospheric side among others.

The geometry of an inductively coupled plasma source, specifically of the antenna, is known to be a significant factor in determining both the plasma and processing uniformity. In an ICP source, plasma is excited by heating electrons in the plasma region near the vacuum side of the dielectric window by oscillating inductive fields produced by the antenna and coupled through the dielectric window. Inductive currents that heat the plasma electrons are derived from RF magnetic fields produced by RF currents in the antenna. The spatial distribution of the magnetic field is a function of the sum of the fields produced by each portion of the antenna conductor. Therefore the geometry of the inductive antenna and efficiency of RF power delivery into the plasma can in large part determine the spatial distribution of the plasma ion density within the reactor chamber.

In some cases, a Faraday shield that is transparent to the inductive component of the electromagnetic field is used to suppress the capacitive coupling from the antenna to the plasma and to prevent a conductive or other contaminating layer from building up on the dielectric window. The geometry and structure of such a shield have an effect on the spatial distribution of plasma inside the chamber as well.

SUMMARY OF THE INVENTION

An objective of the present invention is to improve the plasma processing uniformity on semiconductor wafers, particularly in applications involving etching or higher pressure coating processes.

A particular objective of the present invention is to provide a plasma source for utilization in the plasma processing of large area substrates, including by processes of plasma etching, plasma deposition and plasma cleaning. A more particular objective of the invention is to provide a low inductance inductive device for such a source.

Other objectives are to provide a plasma source for processing larger area substrates with uniform plasma processing, to provide a low inductance inductive device for such a source, and to provide a highly effective plasma source that is simplified and reduces overall chamber cost.

In accordance with the principles of the present invention, an active peripheral ionization source is provided for use in producing a plasma density that yields uniform plasma processing for semiconductor wafers. Such a source is particularly useful for large wafers such as 300 mm wafers. Further in accordance with the present invention, an ICP source is provided with a low inductance inductive radiating device in the form of an antenna or coil for coupling energy into the vacuum plasma processing chamber.

In various embodiments of the invention, an ICP source is provided with a segmented antenna having locally differing parameters and providing a generally lowered impedance. The antenna is configured to produce enhanced peripheral ionization. Typically, such ionization produces a generally ring-shaped plasma which compensates for the overall chamber and source geometry so as to produce a uniform effective plasma at the surface of the wafer for processing the wafer. The ring-shaped plasma is, in many embodiments, in the form of cm annular array of alternating high and low power concentration regions around the periphery of the chamber.

An illustrated embodiment of the invention provides an antenna design for inductively coupled high density plasma sources in which plasma is generated and maintained by inductive elements shaped distribute RF power into the plasma. The inductive elements allow the source to operate in an RF range of electromagnetic energy that is typical for creating plasma in the processing space from process gas introduced therein for processing semiconductors. According to certain embodiments, high and low inductance portions are combined into one inductive system with the inductance of the individual portions controlled by cross-sections and lengths of individual elements. In an illustrated embodiment, the inductance of the high inductance portion of the antenna is increased by providing a conductor loop therein. The loop may be mostly in a plane normal to dielectric window, or in other angled planes.

These and other objectives and advantages of the present invention will be more readily apparent from the following detailed description.

DETAILED DESCRIPTION

Figure 1:
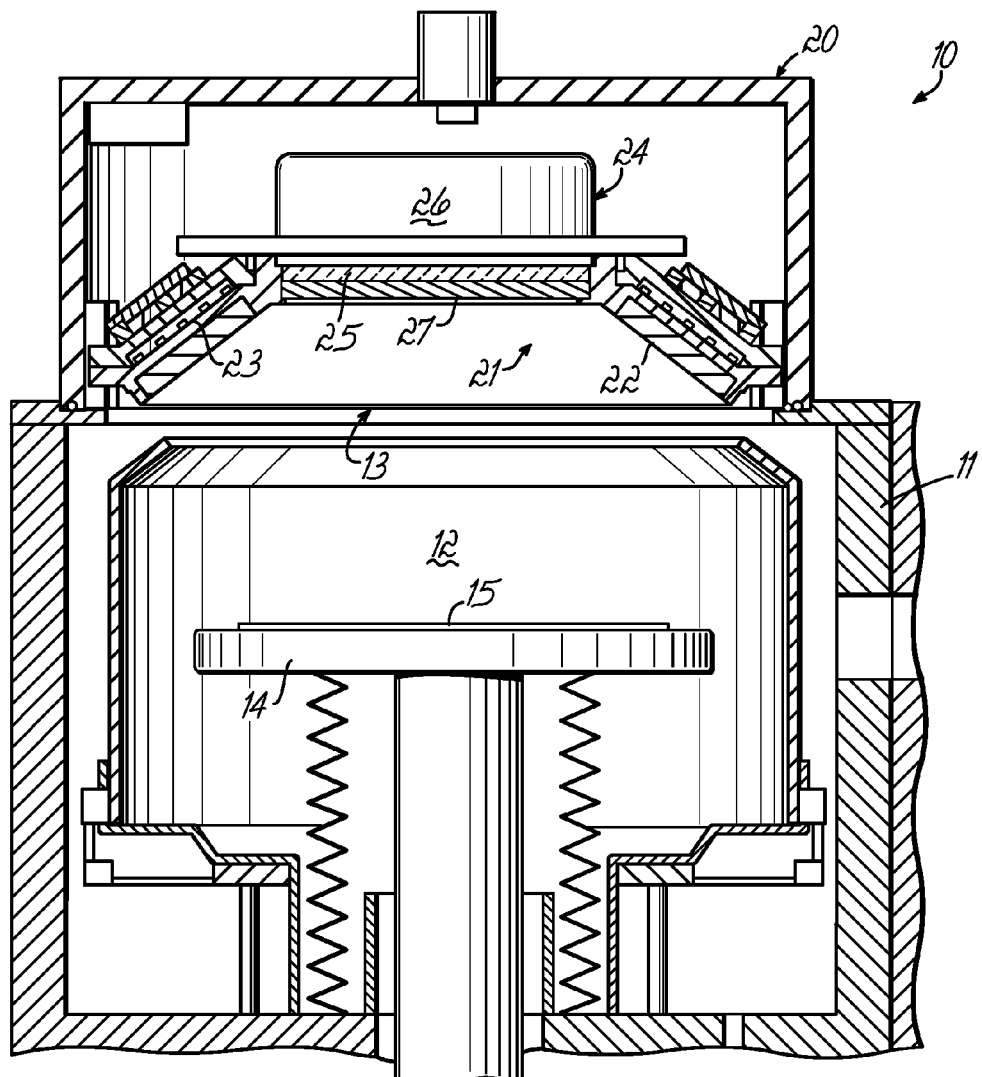
FIG. 1 is a simplified diagram of a prior art ionized physical vapor deposition apparatus of one type to which certain embodiments of the present invention can be applied.

The ICP source of the present invention clan be used in various plasma processing systems, such as those for performing sputter etching and deposition processes, plasma-enhanced CVD (PECVD) processes, ionized PVD (iPVD) processes, and reactive ion etching processes (RIE). FIG. 1 illustrates an iPVD apparatus 10 of a type for the manufacture of semiconductor wafers in which embodiments of the invention are described below. Examples of semiconductor wafer processing machines of the iPVD type are described in U.S. Pat. Nos. 6,080,287 and 6,287,435, both hereby expressly incorporated by reference herein.

The iPVD apparatus 10 includes a vacuum processing chamber 12 enclosed in a chamber wall 11 having an opening 13 at the top thereof in which is mounted an ionized sputtering material source 20, which seals the opening 13 to isolate the vacuum within the chamber 12 from external ambient atmosphere. Within the chamber 12 is a wafer support 14 that holds a semiconductor wafer 15 with a side thereof to be processed facing the opening 13. The ionized material source 20 includes a magnetron cathode assembly 21 that includes an annular target 22, which is the source of the coating material, typically but not necessarily a metal. The cathode assembly also includes a power supply (not shown) for applying a negative DC sputtering potential to the target 22 and a permanent magnet assembly 23 situated behind the target 22, which traps electrons energized by the DC potential over the surface of the target 22 to form a primary plasma that produces ions in the gas within the chamber to sputter material from the target 22.

In the source 20, the target 22 is annular and surrounds a dielectric window 25, typically formed of quartz or alumina, that is sealed to the target 22 at its center. The target 22 and the window 25 form part of a vacuum enclosure for the chamber 12 along with the chamber wall 11. An RF ICP source 24 is situated at the window 25 and couples RF energy into the chamber 12 to energize a secondary high-density inductively coupled plasma within the chamber 12. The RF ICP source 24 includes an antenna or coil 26 situated on the atmospheric side of the window 25 and a deposition baffle or shield 27 that covers the window 25 on the inside of the chamber 12. An RF generator (not shown) is connected across the leads of the antenna 26 through a suitable matching network. Typically, the RF generator operates at the industrial frequency of 13.56 MHz. Pressures in the chamber 12 for iPVD usually fall in the range from 10 mTorr to 150 mTorr.

The antenna 26 and the shield 27 are designed together to most effectively inductively couple RF energy from the antenna 26 into the chamber 12 through the window 25 and shield 27, with low capacitive coupling from the antenna 26 into the chamber 12 that would impose a voltage on the plasma. The shield 27 is further configured to protect the window 25 from accumulated deposition, which, where the coating material is metal in particular, renders the window 25 opaque to radiation from the antenna, and interferes with the coupling of energy into the plasma. Details of antennas and the accompanying shields are described in U.S. Pat. Nos. 6,237,526 and 6,474,258, and U.S. patent application Ser. Nos. 10/080,496 and 10/338,771, all hereby expressly incorporated by reference herein.

Figure 1A:
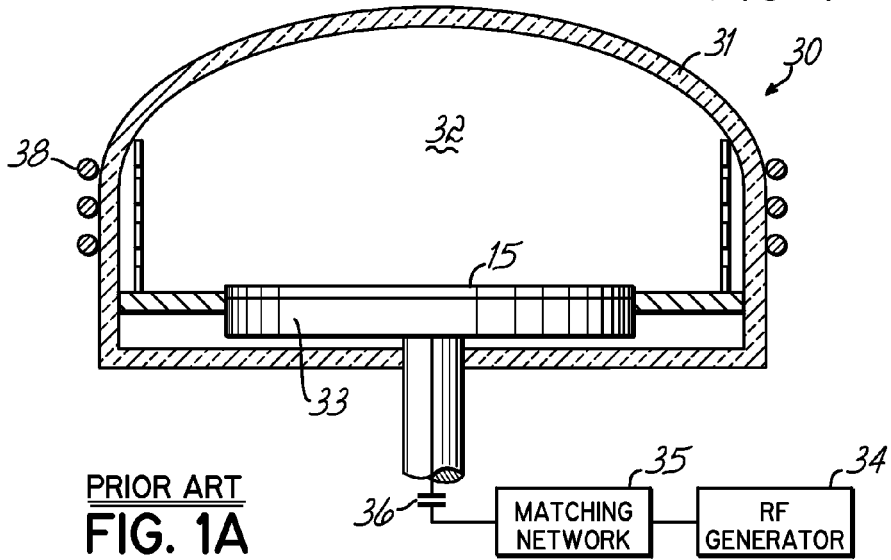
FIG. 1A is a simplified diagram of a prior art plasma etch or plasma cleaning apparatus of one type to which other embodiments of the present invention can be applied.

FIG. 1A illustrates an etch module, in particular an ICP sputter-clean process module 30, to which principles of the present invention can be applied. The module 30 has a vacuum processing chamber 32 enclosed therein by a chamber wall 31, illustrated as a quartz bell jar. Etch modules having metal-walled chambers with limited dielectric windows therein are also used for etch purposes and may also benefit from principles of the invention, as, for example, described in U.S. patent application Ser. No. 09/875,339, hereby expressly incorporated by reference herein. In the chamber 32, wafer 15 to be processed is supported on an RF biased substrate holder 33, to which it maybe held by mechanical clamps, electrostatic chucks or other clamping structure (not shown). RF power is typically biased capacitively to the substrate holder 33 from an RF generator 34 through a matching network 35, and typically also through a capacitor 36.

When RF power is applied, a plasma is generated in the vacuum chamber 32, which typically is filled with an inert gas such as Argon, usually at pressures of from 0.1 to 10 mTorr. The substrate support 33 is generally biased negatively so that positive ions are accelerated towards the substrate 15 with energy sufficient to sputter etch materials from the surface of the wafer 15. Sputter etch rate depends on the energy and ion flux density. Energy is determined by the potential difference between plasma and substrate 15 on the substrate holder 33. Ion flux is determined by bulk plasma density. To increase ion flux towards the surface of the substrate 15, RF energy may be coupled into the chamber 32 by an antenna or coil 38 to form a high-density ICP in the chamber 32.

High-density inductively coupled plasmas have produced processing effects that are greater at the center of the wafers 15 than toward the wafer edges. Applicant has proposed to improve uniformity with a ring-shaped plasma in U.S. Pat. No. 6,534,493, hereby expressly incorporated by reference herein. In that patent, the use of a permanent magnet to shape the plasma was proposed. With the present invention, shaping of a plasma is provided by use of a locally-efficient RF ICP source. Such a source uses, for example, a series or arrangement of locally-efficient plasma generation, for example, by generating concentrations of plasma energy in a ring within the vacuum processing chamber. In the described embodiments, this local coupling efficiency is achieved by various embodiments of locally-efficient antenna structure, locally transparent shield structure, and combinations of antenna and shield structure. The shaped plasma is achieved in certain of the described embodiments by providing such locally-efficient structure in a peripheral ionization source in semiconductor wafer etching and coating processes and systems.

Figure 2:
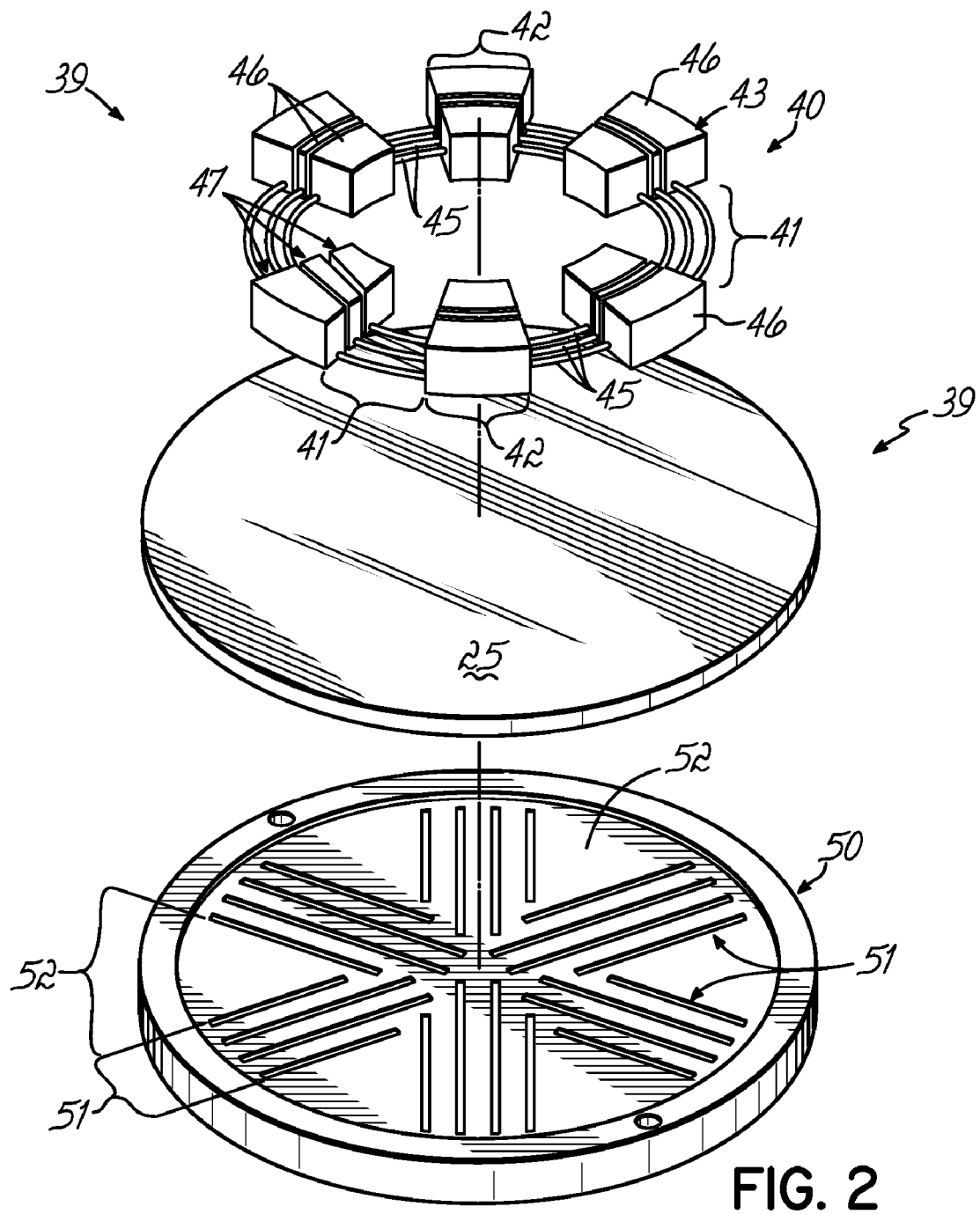
FIG. 2 is an expanded perspective view of a peripheral ionization ICP source according to certain embodiments of the present invention.

FIG. 2 illustrates an embodiment of a peripheral ionization source 39 embodying principles of the present invention. The peripheral ionization source 39 includes a segmented antenna 40 and preferably also a deposition baffle or shield 50, which may be installed in an ICP processing machine, aligned with each other on opposite sides of a dielectric section of, or window 25 in, the vacuum chamber wall of the apparatus. The antenna 40 is located in an atmospheric pressure environment outside of the window 25 while the baffle 50 is located in the vacuum chamber inside of the window 25. The antenna 40 is formed of one or more windings of a conductor 43 having high-efficiency, relatively high-inductance sections 41 alternating with low-efficiency, relatively low-inductance sections 42. The baffle 50, when employed, is formed of relatively transparent areas 51 alternating with relatively opaque areas 52. Installed in the processing apparatus, the high-efficiency sections 41 of the antenna 40 align with the high-transparency sections 51 of the baffle 50 while the low-efficiency sections 42 of the antenna 40 align with the low-transparency sections 52 of the baffle 50. Such sources and alternatives thereto are described in U.S. patent application Ser. No. 10/717,268 referred to above, to which this application is related.

Figure 4:
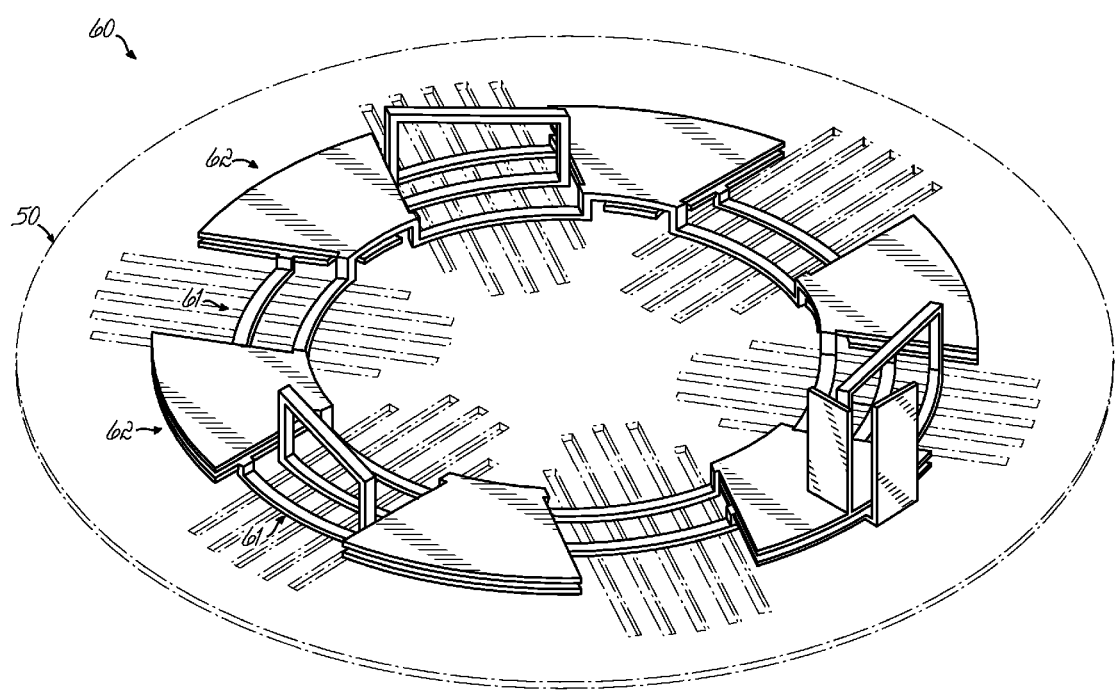
FIG. 4 is a perspective view of a six-segment antenna according to certain embodiments of the invention.

In accordance with the preferred embodiment of the present invention as best shown in FIG. 4, high-density inductively coupled plasmas (ICP) for semiconductor coating and etching systems and processes is generated and maintained by a shaped peripheral inductive element that allows spatial distribution of the RF power into the plasma at locally enhanced ICP efficiency. The peripheral inductive element includes either or both of an antenna 40 and shield structure 50. For purposes of discussion, the antenna 40 refers to any of the various embodiments, illustrated or otherwise, and the shield structure 50 refers to any of the various embodiments, illustrated or otherwise. Similar references are made to sections 41, 42, 51 and 52 of this structure.

A feature of the segmented antenna element 50 is that its total inductance is lower than for a non-segmented antenna, thereby making it technically more suitable for large area plasma processing systems, such as for 300 mm wafers 15, while maintaining the simplicity typical of smaller size ICP sources. The segmented antenna 40 is provided with an azimuthally modulated pitch that provides a spatial distribution of the rf power deposited into plasma, reduced ohmic losses in the deposition shield 50, low-inductance, and locally enhanced RF power density distribution into the plasma. The spatial RF power density distribution allows for the design of a deposition shield 50 with enhanced shielding performance.

Figure 3:
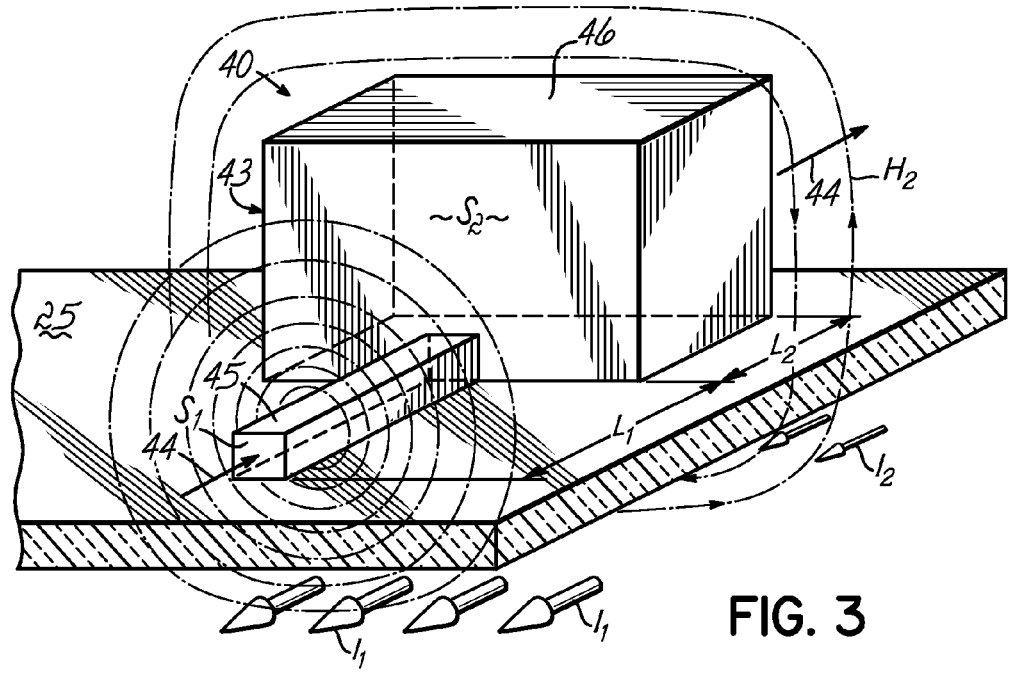
FIG. 3 is a perspective diagram of a section of an antenna conductor for the ICP source of FIG. 2.
Figure 3A:
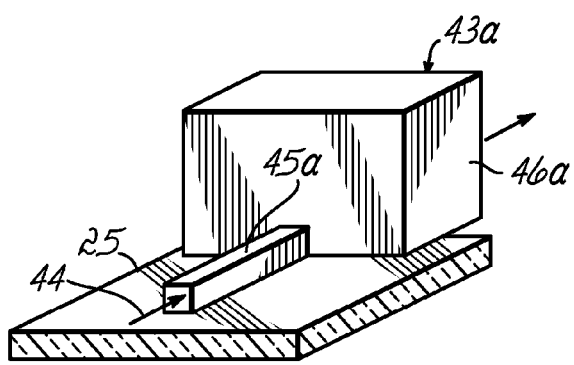
FIGS. 3A-3F are perspective diagrams of alternative embodiments of the conductor of FIG. 3.
Figure 3B:
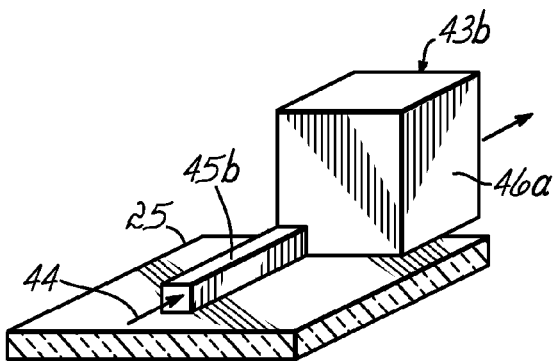
Figure 3C:
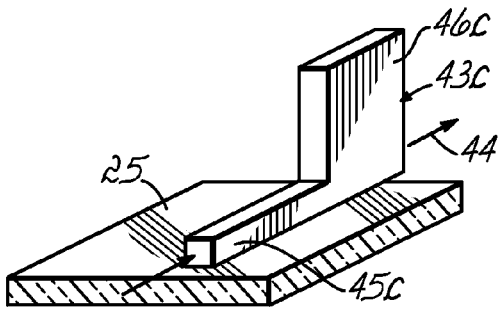
Figure 3D:
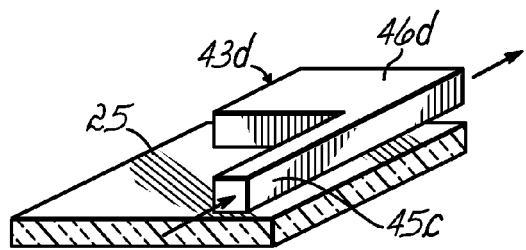
Figure 3E:
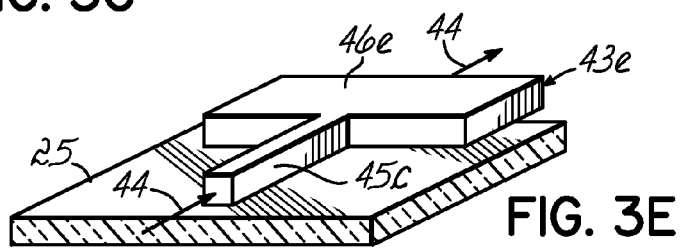

Design of the conductors of the segmented antenna or antennas 40 may be understood by reference to FIG. 3. An antenna 40 may be formed of a serial conductor 43, through which may be considered as instantaneously flowing in a direction indicated by arrows 44, that consists of the serial connection of two sizes of conductors or conductor sectors 45 and 46, each with respectively different cross-sections $S_1$ and $S_2$ in a direction perpendicular to the current flow 44. Each of the different cross-section conductor sectors 45 and 46 has a length defined as $L_1$ and $L_2$, respectively, in a direction parallel to the current flow 44. Accordingly, the conductor 43 may be described as having a "filling factor", $\Phi$, which is defined as a ratio of a conductor length $L_2$, related to a large cross-section portion 46 to a total conductor length $L_1$ and $L_2$, (sum of conductor lengths both for small and large cross-section portions 45 and 46), e.g. $\Phi=L_2/(L_1+L_2)$. The conductor may also be defined in part by the "cross-section ratio", $\Theta$, as the ratio of the cross-sectional area $S_2$ of the large cross-section segment 46 to the area $S_1$ of the small cross-section segment 45, or $\Theta=S_2/S_1$.

A constant RF current flows through the conductor 43. At the RF frequencies used, this current flows close to the surface of the conductor 43 in the manner that it would flow through a cage of wires surrounding a space of the solid conductor's cross-section. In the case of the smaller cross-section segment 45, the surface current density is significantly higher than in the case of the larger cross-section segment 46. Consequently, the induced RF magnetic fields $H_1$ are stronger in the immediate vicinity of the surface of conductor segment 45 than the fields $H_2$ in the vicinity of the surface of conductor 46, and thus stronger inductive coupling will occur, and larger currents $I_1$ will be induced, within the plasma adjacent conductor segment 45 than currents $I_2$ induced adjacent segment 46. RF power coupled into the plasma adjacent segments 45 will in turn be larger than the RF power coupled adjacent segments 46.

Since inductive coupling to the plasma has a threshold in RF power below which only capacitive coupling can occur, the low RF power in the region of the large cross-section conductor sector 46 can be such that the ICP mode of coupling is impossible, where the power in the region adjacent the low cross-section sector 45 is still above the ICP threshold level. As a result, coupling of power is concentrated into some regions and substantially absent from other regions.

Various configurations 43a-43e of the segmented conductors 43 are illustrated in FIGS. 3A-3E. Each of these have small and large cross-section portions 45a-45e and 46a-46e, respectively, each providing different cross-sectional area configurations, some more effective than others. Generally, three-dimensional distributions such as 43a and 43b are more effective, with a dimension extending perpendicular to or away from the window 25, as 43c, being more effective than parallel to the window as 43d or 43e. Instead of segments of differing cross-section, conductor bundles can be made to converge and diverge.

Figure 3F:
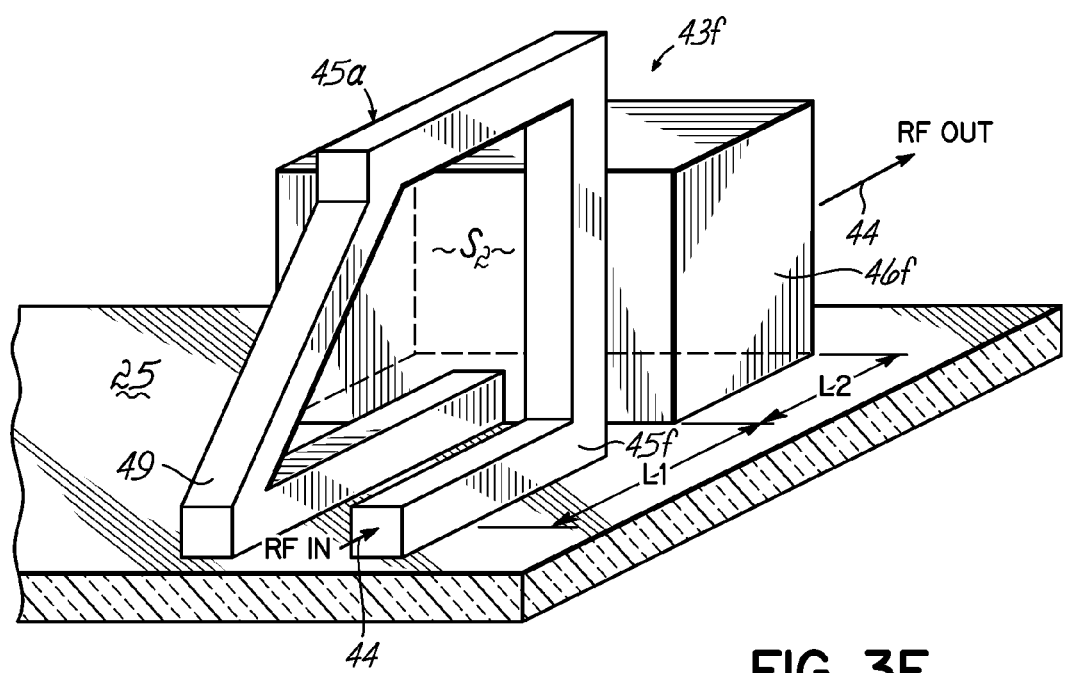

Another configuration 43f of the segmented conductors 43 is illustrated in FIG. 3F. The segmented conductor 43f has a high inductance portion 45a, the inductance of which is increased by a conductor loop 49, in a plane normal to dielectric window 25. The combination of conductor portions 45f and 46f with different cross-sections and lengths, namely one large cross-section portion 46f extending parallel to plasma direction to reduce inductance and the other small cross-section portion 45f extending looped in a plane perpendicular to the chamber or plasma, typically perpendicular to the dielectric window, opposite the chamber side of the antenna. The loop 49 presents two parallel lengths of conductor proximate the dielectric window to locally enhance the field and the power coupling to plasma from the high-inductance antenna segment containing the loop 49.

FIG. 4 shows an embodiment 60 of a segmented conductor antenna 40, which has six sectors high inductance segments 61 and six low inductance segments 62. The antenna 60 shown arranged with a baffle 50, shown in phantom. The low inductance segments 62 of the antenna 60 are formed of large cross-section portions similar to portions 46, one configuration of which is shown. The high inductance segments 61 are shown to include three that are formed of conductor portions similar to portions 45f of FIG. 3F which alternate with three that are formed of conductor portions that are similar to the straight conductor portions 45a of FIG. 3A. Alternatively, all high inductance segments 61 can be configured according to the portions 43f, which include the loops 49, or be configured according to the portions 43a, which contain no loops 49.

The antenna 60, with three of the six segments containing loops 49, is expected to deliver more total power, for example about 9% more total power, than would be deposited into plasma by an antenna 40 having high inductance segments made up only of conductor portions similar to 45a. This means that the antenna 60 will deposit the same amount of power as the antenna 40 having high inductance segments made up only of straight portions 45a. Substituting looped portions 45f having loops 49 for straight portions 45a increase moderately the total inductance of the inductive antenna 60, but to an inductance that is still less than the inductance of a conventional spiral antenna with a similar radius and an equivalent number of loops. An embodiment with loops 49 in all six high inductance segments would have a high total inductance along with a high total deposited power.

Figure 5A:
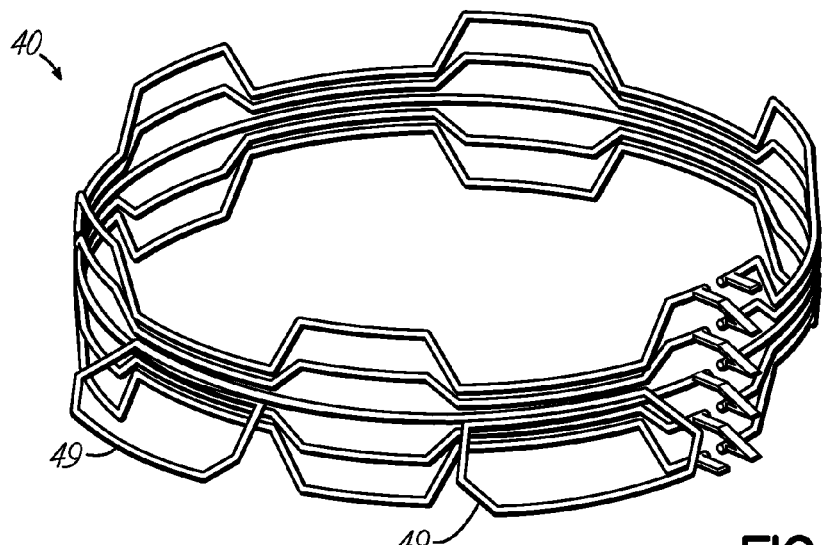
FIGS. 5A-5C are perspective views of portions antennae according to other embodiments of the invention.
Figure 5B:
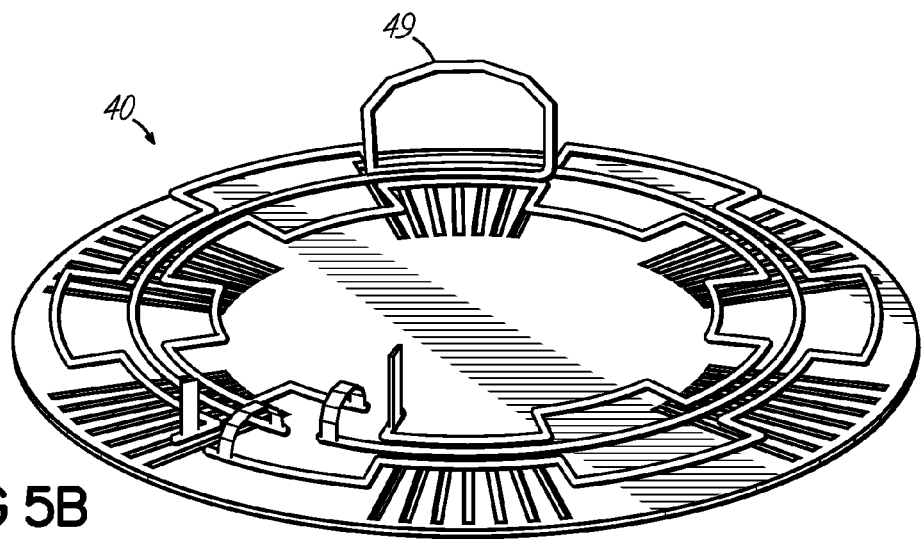
Figure 5C:
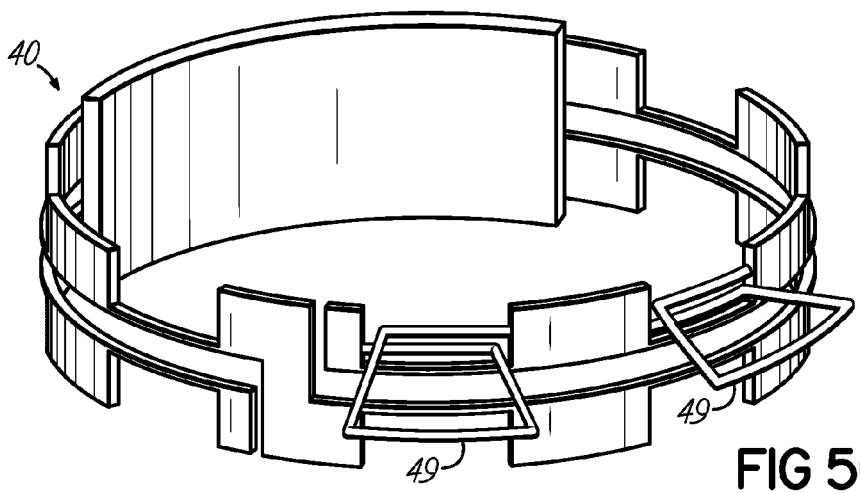

All embodiments disclosed in U.S. patent application Ser. No. 10/717,268 can be modified by adding loops 49 to portions 45 thereof. For example, FIGS. 5A-5C illustrate several such implementations. For simplicity, loops are shown in only some of the high inductance segments 45 on one side of the antenna, but such loops, if included, should be distributed symmetrically around the antenna, either in all high inductance segments 45, alternating around the antenna in three such segments, or on opposite sides in two such segments. Further, the number of total high inductance segments may be more or less than six, preferably, but not necessarily, an even number. Such modification will provide additional benefit in a plasma source having such a modified antenna, enhancing the source's performance, particularly by increasing power deposited locally into the plasma in relation to the inductance of the antenna and in relation to the total power applied to the antenna.

The invention has been described in the context of exemplary embodiments. Those skilled in the art will appreciate that additions, deletions and modifications to the features described herein may be made without departing from the principles of the present invention. Accordingly, the following is claimed.

The invention claimed is:

1. An antenna for an ICP source that produces a high-density inductively coupled plasma in a vacuum chamber of a semiconductor wafer processing apparatus, the antenna comprising:

a conductor having a plurality of windings around a central axis, the windings defining a surface having a plasma side for facing into a processing space within the chamber and an outer side for facing away from the processing space;

the conductor being configured to provide the antenna with a segmented configuration including:

a plurality of high efficiency sections spaced at equal angular intervals around the axis and configured to concentrate current therein and produce relatively high strength magnetic fields adjacent to the conductor on said plasma side thereof, and a plurality of low efficiency sections spaced at equal angular intervals around the axis between adjacent high efficiency sections and configured to more widely distribute current therein and produce relatively low strength magnetic fields adjacent to the conductor on said plasma side;

the high and low efficiency sections being alternately arranged in a ring so as to couple power from said plasma side into the processing space within the chamber to energize a plasma in the processing space in an annular alternating high and low power density distribution;

the conductor having a plurality of 360 degree loops therein, one in each of a plurality of the high efficiency sections, equally spaced around the axis, and extending away from the plasma side of the conductor in a perpendicular direction, each 360 degree loop having parallel ends lying in the winding on said surface and through which current that flows in the winding flows in the same direction parallel to said winding, and having a return section between said ends spaced from said surface on the outer side thereof through which said current flows parallel to said winding in the opposite direction of the current through said ends;

whereby current through said parallel ends of each 360 degree loop enhances the strength of the magnetic fields on the plasma side of said surface adjacent the high-efficiency sections, increasing the efficiency thereof in coupling of power into the processing space to energize high density portions of the plasma, to produce an annular, ring-shaped, segmented plasma of alternating high and low plasma density regions spaced at equal angular intervals around the central axis of the vacuum chamber.

2. The antenna of claim 1 wherein:

the high-efficiency sections provide concentrated antenna current paths, and the low-efficiency sections provide distributed antenna current paths, for currents in the conductor.

3. The antenna of claim 1 wherein:

the high-efficiency sections are formed of small cross-section conductors that provide the concentrated current paths therethrough; and the low-efficiency sections are formed of relatively large cross-section conductors that provide the distributed current paths therethrough.

4. The antenna of claim 1 wherein:

the high-efficiency sections are formed of a plurality of closely spaced conductor segments.

5. The antenna of claim 1 wherein:

the conductor has a plurality of windings;

the high-efficiency sections are formed of a plurality of relatively closely spaced conductor segments of different windings; and the low-efficiency sections are formed of a plurality of conductor segments of different windings that are substantially more widely spaced than the closely spaced conductor segments of which the high efficiency sections are formed.

6. An ICP source comprising the RF antenna of claim 1 and further comprising:

a Faraday shield close to and spaced from the antenna and generally parallel to the conductor having slots therethrough configured to enhance coupling of the magnetic field through the shield and into a plasma in the processing space.

7. An antenna for inductively coupling energy into a high-density plasma in a vacuum chamber, the antenna comprising:

at least one conductor having a plurality of windings, at least one winding having a plurality of 360 degree loops therein;

the antenna having a segmented configuration formed of a plurality of alternating high and low-efficiency sections arranged in a ring;

the high-efficiency sections being formed of concentrated current-carrying segments and the low-efficiency sections being formed of distributed current-carrying segments;

a plurality of the high-efficiency sections each including one of the plurality of the 360 degree loops of the conductor at which the conductor loops away from the winding in a perpendicular direction on one side of the antenna and back to the winding where opposite ends of the loop are adjacent and parallel and through which ends current flows in the same direction such that the magnetic fields produced thereby reinforce; and whereby, when RF current is applied to the conductor, relatively high strength magnetic fields are produced adjacent to the high-efficiency sections near the parallel ends of the loops on a side of the antenna opposite said one side, and relatively low strength magnetic fields are produced adjacent to the low-efficiency sections.

8. The antenna of claim 7 wherein:
the high-efficiency sections are formed of small cross-section portions of the conductor and the low-efficiency sections are formed of relatively large cross-section portions of the conductor.

9. The antenna of claim 7 wherein:
the high-efficiency sections are formed of a plurality of closely spaced conductor segments and the low-efficiency sections of the antenna are formed of a plurality of conductor segments that are substantially more widely spaced than the closely spaced conductor segments.

10. The antenna of claim 7 wherein:
the windings lie in a plane; and
each of the 360 degree loops is generally perpendicular to the plane and extends away from and to one side of the conductor plane.

11. The antenna of claim 7 wherein:
the conductor includes windings lying on a cylindrical surface around an axis; and
the 360 degree loops each lie in a plane generally perpendicular to the axis and extend away from the axis.

12. An ICP source comprising the RF antenna of claim 7 and further comprising:
a Faraday shield close to and spaced from the antenna and generally parallel to the conductor on a side of the antenna opposite the side to which the loops extend, the shield having slots therethrough in the vicinity of the high efficiency sections and that generally lie in respective planes that are perpendicular to the conductor in the high-efficiency sections.

13. An RF antenna for an ICP source for a plasma processing apparatus, the antenna comprising:

a segmented configuration formed of a plurality of alternating high and low-efficiency sections arranged in a ring;

at least one conductor having a plurality of 360 degree loops therein and having a plurality of windings surrounding an axis;

the windings defining a first surface and the 360 degree loops each respectively defining a second surface that is perpendicular to said first surface, one surface being planar and perpendicular to the axis and the other surface being cylindrical and centered on the axis, and both surfaces being parallel to the conductor;

the at least one conductor having an alternating plurality of small cross-section and large cross-section portions, the small cross-section portions each including one of the 360 degree loops; and each of the high-efficiency sections being formed of one or more of the small cross-section portions of the conductor and at least one of the 360 degree loops, wherein the conductor loops away from the winding on one side of the antenna and back to the winding where opposite ends of the loop are adjacent and parallel and through which ends current flows in the same direction such that the magnetic fields produced thereby reinforce, and each of the low-efficiency sections being formed of one or more of the large cross-section portions of the conductor.

14. The antenna of claim 13 wherein:
the first surface is a cylinder whereby the antenna has a segmented cylindrical configuration; and
the second surface is a plane whereby the 360 degree loops each lie generally in the plane perpendicular to the central axis and extend away from the central axis.

15. The antenna of claim 13 wherein:
the first surface is a plane whereby the antenna has a segmented planar configuration; and
the second surface is a cylinder whereby the 360 degree loops each lie generally on the cylinder perpendicular to the plane and each extends away from the plane on the same side thereof.

16. An ICP source comprising the RF antenna of claim 13 and further comprising:
a Faraday shield close to and spaced from the antenna and generally parallel to the conductor on a side of the antenna opposite the side to which the loops extend, the shield having slots therethrough in the vicinity of the high efficiency sections and that generally lie in respective planes that are perpendicular to the conductor in the high-efficiency sections.

* * * * *

UNITED STATES PATENT AND TRADEMARK OFFICE
CERTIFICATE OF CORRECTION

| | | |
|---|---|---|
| PATENT NO. | : 7,673,583 B2 | Page 1 of 1 |
| APPLICATION NO. | : 11/278263 | |
| DATED | : March 9, 2010 | |
| INVENTOR(S) | : Jozef Brcka | |

It is certified that error appears in the above-identified patent and that said Letters Patent is hereby corrected as shown below:

Column 2

Line 54, "cm" should be --an--.

Line 59, after "shaped", insert --to--.

Column 3

Line 26, "portions antennae" should be --antennae portions--.

Line 31, "clan" should be --can--.

Column 4

Line 34, "maybe" should be --may be--.

Column 5

Line 31, "is" should be --are--.

Line 48, "rf" should be --RF--.

Column 6

Line 46, delete "with" and insert --have--.

Line 59, after "antenna 60", insert --is--.

Column 7

Line 11, "increase" should be --increases--.

Signed and Sealed this

Eighth Day of March, 2011

David J. Kappos
*Director of the United States Patent and Trademark Office*